United States Patent [19]

Otty

[11] Patent Number: 4,588,615

[45] Date of Patent: May 13, 1986

[54] RESIN IMPREGNATION METHOD

[76] Inventor: Malcolm Otty, 27 Column Road, West Kirby, Merseyside, Liverpool, United Kingdom

[21] Appl. No.: 667,732

[22] Filed: Nov. 2, 1984

[30] Foreign Application Priority Data

Nov. 2, 1983 [GB] United Kingdom ............... 8329289

[51] Int. Cl.⁴ .................... B05D 3/00; B05D 1/18
[52] U.S. Cl. .................... 427/294; 427/296; 427/350; 427/366; 427/389.8; 427/389.9; 427/392; 427/430.1; 427/434.3
[58] Field of Search ........... 427/294, 296, 350, 430.1, 427/434.3, 392, 389.9, 389.8, 366

[56] References Cited

U.S. PATENT DOCUMENTS

| 2,279,553 | 4/1942 | Bradt | 427/296 |
| 3,825,441 | 7/1974 | Achermann et al. | 427/296 X |
| 4,288,475 | 9/1981 | Meeker | 427/294 |
| 4,440,808 | 4/1984 | Mitter | 427/294 X |

Primary Examiner—Thurman K. Page
Attorney, Agent, or Firm—Oblon, Fisher, Spivak, McClelland & Maier

[57] ABSTRACT

A fabric is resin-impregnated by placing it between a liquid resin surface and an evacuated space. The fabric can be laid on top of or passed continuously over a liquid resin surface, the resin being heated to a temperature at which it flows readily. A pre-preg produced according to the method can be laminated with other pre-preg or fabric layers into board, but several fabric layers can be impregnated together to form a thick pre-preg.

15 Claims, 3 Drawing Figures

RESIN IMPREGNATION METHOD

BACKGROUND TO THE INVENTION

This invention relates to resin impregnation of fabric.

Fabric is impregnated with resin for a variety of purposes, one such being the production of board for constructional, heat and electrical insulation and other purposes. One example of such board is the board which carries printed electrical circuits, known as printed circuit board or p.c.b.

As a step in the manufacture of such board, fabric is impregnated with resin by being run through a bath of liquid resin and the impregnated fabric is then dried. Subsequently, layers of dried, impregnated fabric are hot pressed together to form whatever thickness of laminate is required. The usual fabrics are woven cottons, synthetics and glass fibre. The fabrics are usually subjected to a pre-treatment and pre-drying to condition them to pick-up and be wet by the resin.

The step of drying the impregnated fabric, so that the fabric can be rolled up or cut up and stacked, is done in a drying tower, the fabric being hauled up continuously out of the resin bath.

BRIEF DESCRIPTION OF THE INVENTION

The present invention provides methods and apparatus for resin-impregnating fabric that enable different—less strong and less costly—fabric constructions to be used and enable several layers of fabric to be impregnated together, as well as reducing or even eliminating the need, at least using certain fabric materials, for pre-treatment of the fabric, and yet produce, eventually, a board or other product with superior properties at the same or a lower cost than conventionally produced such products.

The invention comprises a method for resin-impregnating a fabric comprising placing the fabric between a liquid resin surface and an evacuated space.

The fabric may be laid on top of a liquid resin surface, and may be passed continuously over the liquid resin surface.

The evacuated space is desirably maintained at a pressure below 0.5 atmospheres and preferably below 100 mmHg, most preferably between 10 and 20 mmHg absolute.

The resin may be heated to a temperature at which it flows readily, and, for the resins most commonly used, this is about 30° C.

The fabric may be multi-layered, having up to four layers of fabric or even more—the fabric can be fed as an assembled four layer laminate from four supply rolls.

A suitable fabric is stitch bonded fabric, by which is meant both yarn stitch bonded, such as is made on a Maliwatt or Arachne stitch bonding machine, and fleece stitch bonded, such as is made on a Malivlies or Arabeva stitch bonding machine. Such fabrics have good wicking and absorptive properties, while being essentially inexpensive fabric constructions.

A preferred fabric material for many purposes is high temperature polyamide, such as Nomex (RTM). It is found that stitch bonded fabrics of such material require essentially no pre-treatment to condition them to absorb and be wet by resin when used in the method of the present invention. Currently such fabrics are costly because of the very high price of Nomex fibre as compared to glass and other fibres. Nevertheless, the inexpensive method of fabrication combined with the elimination of pre-treatment and the other cost-savings inherent in or resulting from the present invention enable such materials to be used in the maufacture of board and other products to give a product at the same or a lower cost, yet having the advantages of high-temperature polyamide fibres in the areas of resistance to thermal degradation, electrical insulation and mechanical properties—board made using Nomex fibre is more easily cut and machined then board using the much more brittle glass fibre. The Nomex fibre is also lighter in weight than glass fibre and Nomex-based board shows a substantial advantage in this regard when used for aircraft panelling.

In addition, Nomex is not subject to the same environmental and occupational hazards as glass.

Stitch bonded fabrics, especially fleece fabrics such as Malivlies and Arabeva fabrics, do not have the same strength as woven fabrics, and on that account could not easily be used in the conventional processes because the weight of impregnated fabric hanging in the drying tower would deform or even rupture the fabric.

However, according to the present invention the impregnation and drying process can be carried out with the fabric running horizontally. The relative lack of strength of the preferred fabrics is therefore of no account so far as the manufacturing process is concerned, and since the strength of the board or other products after the resin has been fully cured is not at all dependent on the fabric strength, the end product is in no way impaired. In fact, an account of the substantially complete wetting-out of the fabric and the substantially complete exclusion of air from the matrix brought about by the methods of the invention, the resulting product could well be stronger than conventional—especially glass-based—products.

The fabric may be in a reduced pressure atmosphere before contacting the resin.

It is convenient to process the fabric in one meter widths, but clearly wider or narrower fabrics can be worked with. A typical throughput speed would be about 10 m/min, though, again, higher or lower speeds can be used according to circumstances, and, for higher speeds, a longer impregnation path can be used. At 10 m/min on one to four layers of stitch bonded Nomex fabric, for example, the liquid resin surface would be about 1 m long.

Typically, the fabric will have a dry weight of about 300 gm/m$^2$, but higher or lower weights could be used. Resin pick-up is desirably about 30% by weight of dry fabric.

The resin is preferably a heat curing resin as used in the conventional processes. Unlike conventional processes, however, a solventless resin can be used and is preferred on the ground of reduced cost through saving on loss of solvent.

After impregnation, the fabric may be passed through an oven to dry it—the oven can, of course, be horizontal—before being wound up on a roll or, especially in the case of multilayer laminates, guillotined and stacked.

The invention also comprises apparatus for resin-impregnating fabric comprising means defining a liquid resin surface and an evacuated space with the fabric between the said surface and said space.

The apparatus may contain a liquid resin container and an evacuable hood adapted to the container and means holding the fabric between the resin surface and the evacuated hood. The apparatus may further comprise means for guiding a moving fabric through the hood over the liquid resin surface in the container, and said guiding means may comprise input and output rollers, and may be adapted to increasingly immerse the fabric in the liquid surface as it moves thereacross.

The apparatus may comprise inlet and outlet seals where the fabric enters and leaves the hood. An inlet seal may comprise opposed, sprung-together plates between which the fabric passes, and said plates may be perforated and in an evacuated chamber whereby air contained in the incoming fabric is extracted through the perforated plates. An outlet seal may comprise squeeze rollers, which may be adjustable to control the thickness of the impregnated fabric—effecting also a doctoring effect returning excess liquid resin to the container.

The apparatus may also comprise resin heating means, which may be so arranged as to heat resin only in the immediate region of the fabric immediately prior to being picked up thereby. Said heating means may comprise a grid just underlying the resin surface level. The grid may be heated electrically, or by heat exchange with a hot fluid such as water. The heater may however be a vapour phase heater.

The container and hood may be separable to permit introduction of the fabric—the container may be raisable and lowerable for engagement with and disengagement from the hood.

The apparatus may comprise pump means for the resin, and resin-level control means maintaining the liquid resin level in the container.

The invention also comprises a dried, impregnated fabric made by a method or on apparatus as described above in connection with the invention, and a board or other product made by hot pressing such dried, impregnated fabric.

BRIEF DESCRIPTION OF THE DRAWINGS

One embodiment of apparatus and a method for resin-impregnating fabric according to the invention, and impregnated fabric and board produced therefrom will now be described with reference to the accompanying drawings, in which.

DESCRIPTION OF THE PREFERRED EMBODIMENT

Figure 1:
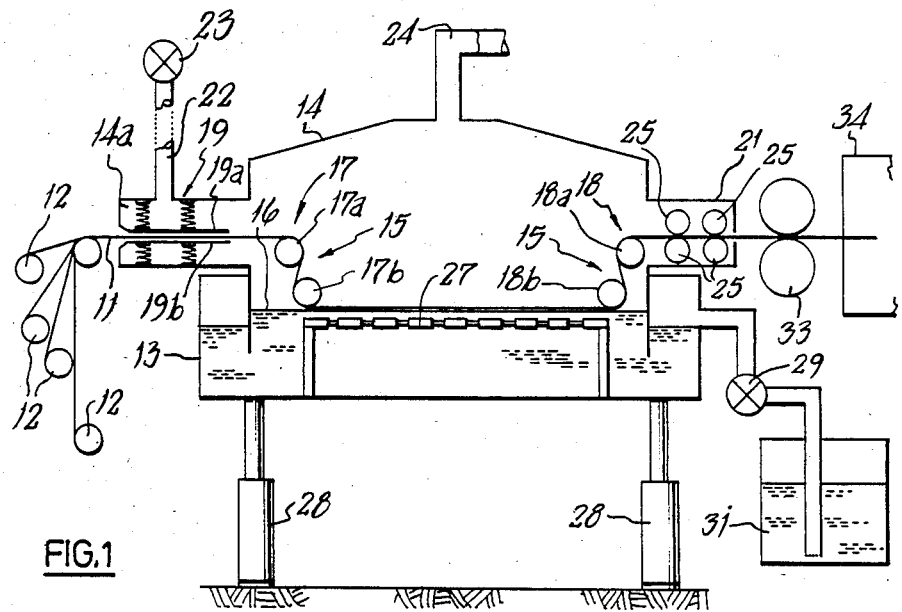
FIG. 1 is a sectional side elevation of one embodiment of apparatus.
Figure 2:
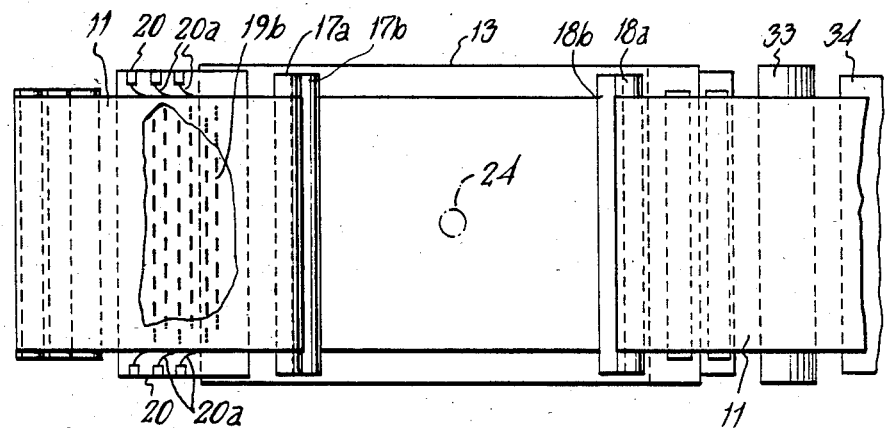
FIG. 2 is a plan view of the embodiment illustrated in FIG. 1.

FIGS. 1 and 2 illustrate apparatus for resin-impregnating fabric 11, supplied in four layers from supply rolls 12, comprising a liquid resin container 13 and an evacuable hood 14 adapted to the container 13 and means 15 holding the fabric 11 between the resin surface 16 and the evacuated hood 14. The said means 15 comprise input and output rollers 17, 18 for guiding the moving fabric 11 through the hood 14 over the liquid resin surface 16.

The rollers 17, 18 each comprise a fixed roller 17a, 18a and an adjustable roller 17b, 18b by which the run of the fabric 11 relative to the resin surface 16 can be controlled and by which, if desired, the fabric 11 can be increasingly immersed in the liquid surface as it moves thereacross—it is important for the process, however, that for much of its travel across the surface one face of the fabric is exposed to the evacuated space so that any air trapped within the fibrous structure is removed and resin is drawn in to replace it.

Inlet and outlet seals 19, 21 are provided on the hood 14. The inlet seal 19 comprises opposed, sprung-together plates 19a, 19b between which the fabric 11 passes. The plates 19a, 19b are perforated and in an evacuated chamber 14a which is in essence an extension of the evacuated space of the hood 14, but with a separate connection 22 to suction pump means 23—the hood proper has an upper main vacuum connection 24—whereby air contained in the incoming fabric 11 is rapidly extracted through the perforated plates 19a, 19b.

Edge seals 20 are provided, comprising resilient leaves 20a pressing on the edges of the fabric 11.

The outlet seal 21 comprises squeeze rollers 25, which are adjustable so as to control the thickness of the impregnated fabric, the adjustment being via a screw-down arrangement 26. Excess resin pick-up is in effect "doctored" off by these rollers and returns to the container 13.

The container 13 includes resin heating means 27 so arranged as to heat resin only in the immediate region of the fabric 11 immediately prior to being picked up thereby. The heating means 27 comprise a grid of somewhat flattened tubes heated by a hot fluid such as water at 30° C. or a vapour phase heating substance such for example as Dowtherm (RTM). The grid is preferably so dimensioned and arranged as to regulate the supply of liquid resin to the fabric by virtue of the relative areas of its apertures and elements in conjunction with the vacuum level in the hood 14 and the viscosity of the resin.

The container 13 and hood 14 are separable to permit introduction of the fabric 11—the container 13 is to this end raisable and lowerable on air jacks 28 for engagement with and disengagement from the hood 14.

Pump means 29 maintain resin flow from a supply reservoir 31 to the container 13 and a level sensing arrangement 32 controls delivery from the pump means 29.

Output feed rollers 33 haul the fabric 11 through the apparatus and pass it to a horizontal drying oven 34 which is maintained at a suitable temperature and is sufficiently long so that the resin impregnated fabric is dried so that it can be wound or guillotined and stacked.

Figure 3:
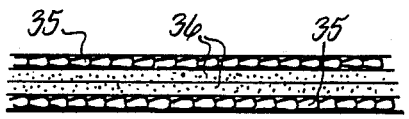
FIG. 3 is a cross-section through a multilayer, resin impregnated fabric.

FIG. 3 illustrates diagrammatically a resin-impregnated fabric comprising outer layers of Maliwatt-type yarn stitch bonded fabric 35 and inner layers of Malivlies-type fleece stitch bonded fabric 36, all of nominal weight 300 gm/m$^2$, in a matrix of resin with an add-on weight of about 400 gm/m$^2$. Such a resin-impregnated fabric will be subsequently hot pressed either as flat board or moulded, shaped articles.

What I is claim is:

1. A method for resin impregnating a fabric comprising the steps of:
    forming a bath of resin having a liquid resin surface;
    evacuating a space above said surface; and
    placing said fabric horizontally on said surface with one side of said fabric exposed to said evacuated atmosphere,
    whereby said resin supports and impregnates said fabric.

2. The method of claim 1, including the steps of:
    positioning at least two mutually spaced fabric support means adjacent said surface; and extending said fabric between said support means and on said surface, said fabric being supported by said surface between said support means.

3. A method according to claim 1, in which the fabric is passed continuously moved along side liquid resin surface.

4. A method according to claim 1, in which the evacuated space is maintained at a pressure of below 0.5 atmospheres.

5. A method according to claim 4, in which the evacuated space is maintained at a pressure of 10–20 mm Hg absolute.

6. A method according to claim 1, in which the resin is heated to a temperature at which it flows readily.

7. A method according to claim 6, in which the resin is heated to about 30° C.

8. A method according to claim 1, in which the fabric is multi-layered.

9. A method according to claim 8, in which there are up to four layers of fabric.

10. A method according to claim 1, in which the fabric comprises a stitch bonded fabric.

11. A method according to claim 1, in which the fabric is in a reduced pressure atmosphere before contacting the resin.

12. A method according to claim 1, in which the fabric is passed over the resin surface at a linear speed in the order of 10 m/min.

13. A method according to claim 1, in which the fabric has a dry weight of the order of 300 gm/cm$^2$.

14. A method according to claim 13, in which the resin pick-up is of the order of 30% by weight of dry fabric.

15. The method of claim 2 including the step of continually passing said fabric between said support means.

* * * * *